(12) United States Patent
Lim

(10) Patent No.: US 11,862,270 B2
(45) Date of Patent: Jan. 2, 2024

(54) MEMORY DEVICE WITH FAILED MAIN BANK REPAIR USING REDUNDANT BANK

(71) Applicant: YANGTZE MEMORY TECHNOLOGIES CO., LTD., Wuhan (CN)

(72) Inventor: Sangoh Lim, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 105 days.

(21) Appl. No.: 17/502,475

(22) Filed: Oct. 15, 2021

(65) Prior Publication Data

US 2022/0310185 A1    Sep. 29, 2022

Related U.S. Application Data

(63) Continuation of application No. PCT/CN2021/082687, filed on Mar. 24, 2021.

(51) Int. Cl.
*G11C 29/12* (2006.01)
*G11C 29/44* (2006.01)
(Continued)

(52) U.S. Cl.
CPC ...... *G11C 29/1201* (2013.01); *G11C 29/4401* (2013.01); *G11C 29/785* (2013.01); *H03K 19/1737* (2013.01)

(58) Field of Classification Search
CPC ............ G11C 29/1201; G11C 29/4401; G11C 29/785; G11C 29/808; G11C 29/81; (Continued)

(56) References Cited

U.S. PATENT DOCUMENTS

| 5,347,484 A | 9/1994 | Kwong et al. |
| 7,962,784 B2 | 6/2011 | Lakhani et al. |

(Continued)

FOREIGN PATENT DOCUMENTS

| CN | 1379878 A | 11/2002 |
| CN | 1567475 A | 1/2005 |

(Continued)

OTHER PUBLICATIONS

International Search Report issued in corresponding International Application No. PCT/CN2021/082696, dated Dec. 22, 2021, 4 pages.

(Continued)

*Primary Examiner* — Mohammed A Bashar
(74) *Attorney, Agent, or Firm* — BAYES PLLC

(57) ABSTRACT

In certain aspects, a memory device includes an array of memory cells, an input/output (I/O) circuit, and control logic coupled to the I/O circuit. The array of memory cells includes a plurality of banks including a plurality of main banks and a redundant bank. The I/O circuit is coupled to each pair of adjacent banks of the plurality of banks and configured to direct a piece of data to or from either bank of each pair of adjacent banks. The control circuit is configured to select one bank of each pair of adjacent banks based on bank fail information indicative of a failed main bank of the plurality of main banks. The control circuit is further configured to control the I/O circuit to direct the piece of data to or from the selected bank of each pair of adjacent banks.

20 Claims, 13 Drawing Sheets

(51) Int. Cl.
*G11C 29/00* (2006.01)
*H03K 19/173* (2006.01)

(58) Field of Classification Search
CPC ... G11C 29/844; G11C 29/848; G11C 29/883; G11C 29/44; H03K 19/1737
See application file for complete search history.

(56) References Cited

U.S. PATENT DOCUMENTS

| | | | |
|---|---|---|---|
| 8,015,438 | B2 | 9/2011 | Bruennert et al. |
| 9,741,454 | B2 | 8/2017 | Lee et al. |
| 2003/0106001 | A1 | 6/2003 | Kurumada et al. |
| 2004/0174764 | A1 | 9/2004 | Matsuoka et al. |
| 2004/0213057 | A1* | 10/2004 | Tanabe .................. G11C 29/83 365/200 |
| 2011/0051538 | A1 | 3/2011 | Lunde et al. |
| 2012/0182817 | A1* | 7/2012 | Fujiwara ................. G06F 12/06 365/200 |
| 2013/0117602 | A1 | 5/2013 | Kim et al. |
| 2013/0117636 | A1 | 5/2013 | Kim et al. |
| 2019/0087291 | A1 | 3/2019 | Schicht et al. |

FOREIGN PATENT DOCUMENTS

| | | |
|---|---|---|
| CN | 104637534 A | 5/2015 |
| CN | 110111834 A | 8/2019 |
| JP | 2001176291 A | 6/2001 |

OTHER PUBLICATIONS

International Search Report issued in corresponding International Application No. PCT/CN2021/082687, dated Dec. 23, 2021, 4 pages.

\* cited by examiner

| | DATA 1ST 8N | DATA 2ND 8N |
|---|---|---|
| B0_L | 0 | 8 |
| RED | x | x |
| B0_H | 1 | 9 |
| RED | x | x |
| B1_L | 2 | 10 |
| RED | x | x |
| B1_H | 3 | 11 |
| RED | x | x |
| B2_L | 4 | 12 |
| RED | x | x |
| B2_H | 5 | 13 |
| RED | x | x |
| B3_L | 6 | 14 |
| RED | x | x |
| B3_H | 7 | 15 |
| RED | x | x |

FIG. 6A

| | DATA 1ST 8N | DATA 2ND 8N |
|---|---|---|
| B0_L | 0 | x |
| RED | x | 8 |
| B0_H | 1 | 9 |
| RED | x | x |
| B1_L | 2 | 10 |
| RED | x | x |
| B1_H | 3 | 11 |
| RED | x | x |
| B2_L | 4 | 12 |
| RED | x | x |
| B2_H | x | 13 |
| RED | 5 | x |
| B3_L | 6 | 14 |
| RED | x | x |
| B3_H | 7 | 15 |
| RED | x | x |

FIG. 6B

| B0_L | B0_H | B1_L | B1_H | RED | B2_L | B2_H | B3_L | B3_H |
|---|---|---|---|---|---|---|---|---|
| 0 | 1 | 2 | 3 | x | 4 | 5 | 6 | 7 |
| 8 | 9 | 10 | 11 | x | 12 | 13 | 14 | 15 |

DATA 1ST 8N / DATA 2ND 8N — 702, 704

FIG. 10A

| | B0_L | B0_H | B1_L | B1_H | RED | B2_L | B2_H | B3_L | B3_H |
|---|---|---|---|---|---|---|---|---|---|
| DATA 1ST 8N | 0 | 1 | 2 | 3 | 4 | 5 | x | 6 | 7 |
| DATA 2ND 8N | x | 8 | 9 | 10 | 11 | 12 | 13 | 14 | 15 |

FIG. 10B

| | B0_L | B0_H | B1_L | B1_H | RED | B2_L | B2_H | B3_L | B3_H |
|---|---|---|---|---|---|---|---|---|---|
| DATA 1ST 8N | 0 | 1 | x | 2 | 3 | 4 | 5 | 6 | 7 |
| DATA 2ND 8N | 8 | 9 | 10 | 11 | 12 | x | 13 | 14 | 15 |

FIG. 10C

MEMORY DEVICE WITH FAILED MAIN BANK REPAIR USING REDUNDANT BANK

CROSS-REFERENCE TO RELATED APPLICATIONS

This application is continuation of International Application No. PCT/CN2021/082687, filed on Mar. 24, 2021, entitled "MEMORY DEVICE WITH FAILED MAIN BANK REPAIR USING REDUNDANT BANK," which is hereby incorporated by reference in its entirety. This application is also related to U.S. application Ser. No. 17/502,446, filed on Oct. 15, 2021 even date, entitled "MEMORY DEVICE WITH FAILED MAIN BANK REPAIR USING REDUNDANT BANK," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory or NAND Flash memory. As the number of memory cells continues increasing in Flash memory, failed (bad) memory cells can occur during the manufacturing of the memory device.

For example, most NAND Flash memory devices are shipped from the foundry with some failed memory cells. These cells are typically identified according to a specified failed cell marking strategy. By allowing some bad cells, manufacturers can achieve higher yields than would be possible if all cells had to be verified to be good. This significantly reduces NAND Flash memory costs and only slightly decreases the storage capacity of the parts.

SUMMARY

In an aspect, a memory device includes an array of memory cells, an input/output (I/O) circuit, and control logic coupled to the I/O circuit. The array of memory cells includes a plurality of banks including a plurality of main banks and a redundant bank. The I/O circuit is coupled to each pair of adjacent banks of the plurality of banks and configured to direct a piece of data to or from either bank of each pair of adjacent banks. The control circuit is configured to select one bank of each pair of adjacent banks based on bank fail information indicative of a failed main bank of the plurality of main banks. The control circuit is further configured to control the I/O circuit to direct the piece of data to or from the selected bank of each pair of adjacent banks.

In another aspect, a system includes a memory device configured to store data and a memory controller coupled to the memory device and configured to control the memory device. The memory device includes an array of memory cells, an I/O circuit, and control logic coupled to the I/O circuit. The array of memory cells includes a plurality of banks including a plurality of main banks and a redundant bank. The I/O circuit is coupled to each pair of adjacent banks of the plurality of banks and configured to direct a piece of data to or from either bank of each pair of adjacent banks. The control circuit is configured to select one bank of each pair of adjacent banks based on bank fail information indicative of a failed main bank of the plurality of main banks. The control circuit is further configured to control the I/O circuit to direct the piece of data to or from the selected bank of each pair of adjacent banks.

In still another aspect, a method for operating a memory device is provided. The memory device includes an array of memory cells including a plurality of banks. The plurality of banks include a plurality of main banks and a redundant bank. Bank fail information indicative of a failed main bank of the plurality of main banks is obtained. One bank of each pair of adjacent banks of the plurality of banks is selected based on the bank fail information. Directing a piece of data to or from the selected bank of each pair of adjacent banks is controlled.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 6A and 6B illustrate a failed main bank repair scheme using redundant banks implemented by the memory device in FIG. 5.

FIGS. 10A-10C illustrate an exemplary failed main bank repair scheme using redundant banks implemented by the memory device in FIGS. 7-9, according to some aspects of the present disclosure.

Figure 1:
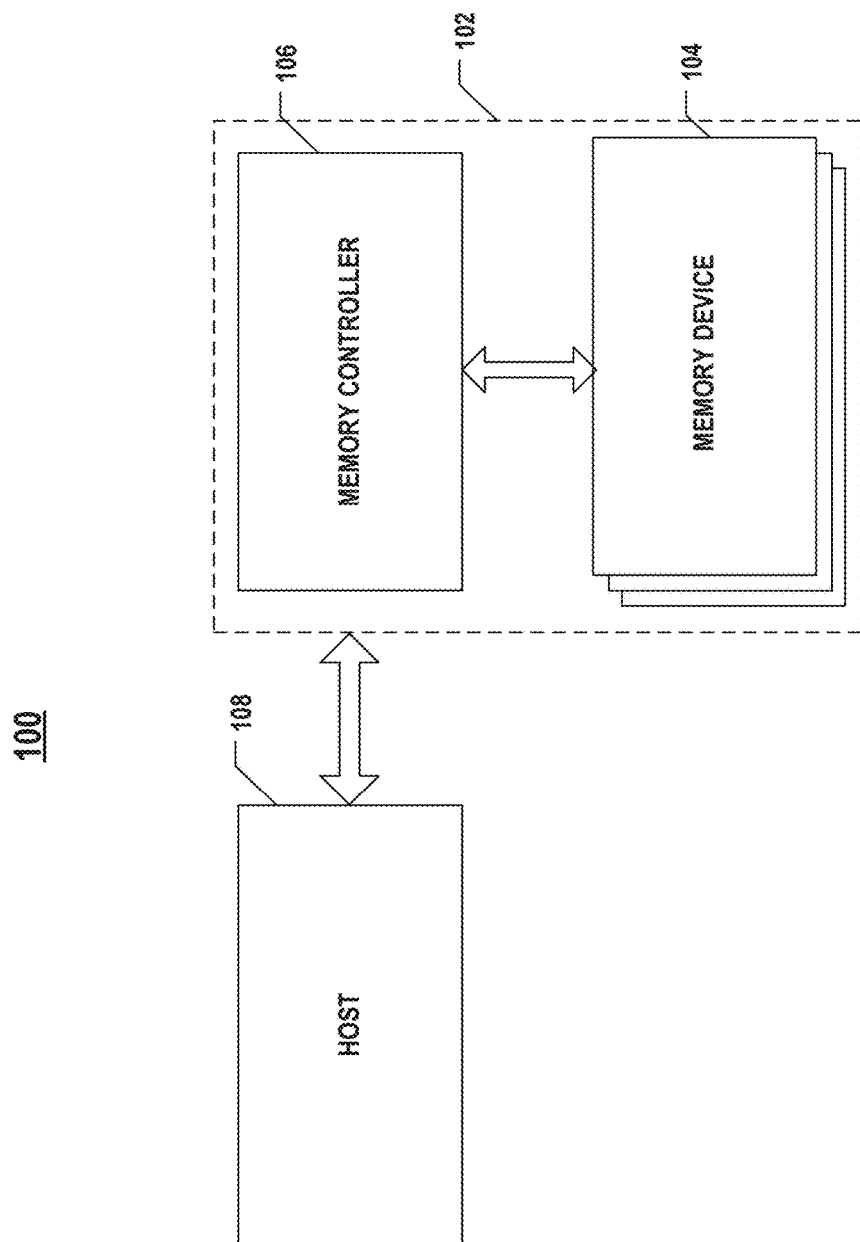
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As the number of memory cells continues to increase to meet the continuously increasing demand for larger storage capability, the chance of memory cell failure also increases during the fabrication of memory devices. One way to deal with the failed memory cells is adding redundant memory cell areas (e.g., redundant banks, a.k.a. redundant columns or redundant groups) besides main memory cell areas (e.g., main banks, a.k.a. main columns or main groups). For each memory device, if the number of failed memory cell areas identified during the post-fabrication test is below a limit (e.g., not greater than the number of redundant memory cell areas), then a repair scheme can be employed such that the redundant memory cell areas can replace the failed memory cell areas for reading and writing data when operating the memory device.

Some known memory devices, such as NAND Flash memory devices, can perform concurrent data input/output (I/O) operations to write or read 8 pieces of data (e.g., 8 bytes) to or from 8 physically separated main memory cell areas (e.g., main banks). The same number of 8 redundant memory cell areas (e.g., redundant banks) are coupled to the main memory cell areas, respectively. Once a main memory cell area is identified as a failed main memory cell area, the corresponding redundant memory cell area replaces the failed memory cell area in data input and output, according to the known repair scheme. However, such a repair scheme and redundant bank design have various issues. For example, the large number of redundant banks can waste chip area as oftentimes not all of them may be used. The relatively large number of redundant banks may also affect the flexibility of the repair scheme. Also, the extra routing length to couple each main bank and the respective redundant bank may increase the skew of data line.

To address one or more of the aforementioned issues, the present disclosure introduces a solution in which a smaller number of redundant banks than the main banks can be used along with a flexible repair scheme to handle failed main banks in memory devices, such as NAND Flash memory devices. Consistent with certain aspects of the present disclosure, multiplexers can be used to couple adjacent banks, such that the input or output data can be shifted between adjacent banks (either main bank or redundant bank). As a result, a redundant bank is no longer dedicated to a specific main bank but instead, can replace any failed main bank without coupling to each main bank. Therefore, the total chip area of redundant banks, as well as the chance of wasting redundant bank area, can be both significantly reduced. Moreover, as each bank is coupled to only adjacent bank(s) due to the data shift-based repair scheme, the skew between each data line can be reduced as well with shorten routing length of data lines. The redundant bank design and data shift-based repair scheme disclosed herein can also increase the repair flexibility even with a smaller number of redundant banks compared with the known approach.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as NAND Flash memory device, can include a smaller number of redundant banks than the main banks and implement a flexible, data shift-based repair scheme in data input and output operations to handle failed main banks identified during the post-fabrication test of memory device 104.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
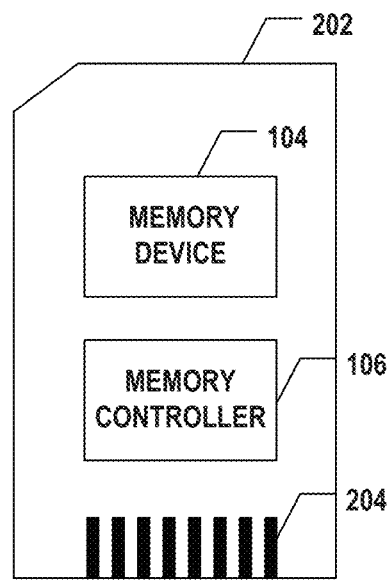
FIG. 2A illustrates a diagram of an exemplary memory card having a memory device, according to some aspects of the present disclosure.
Figure 2B:
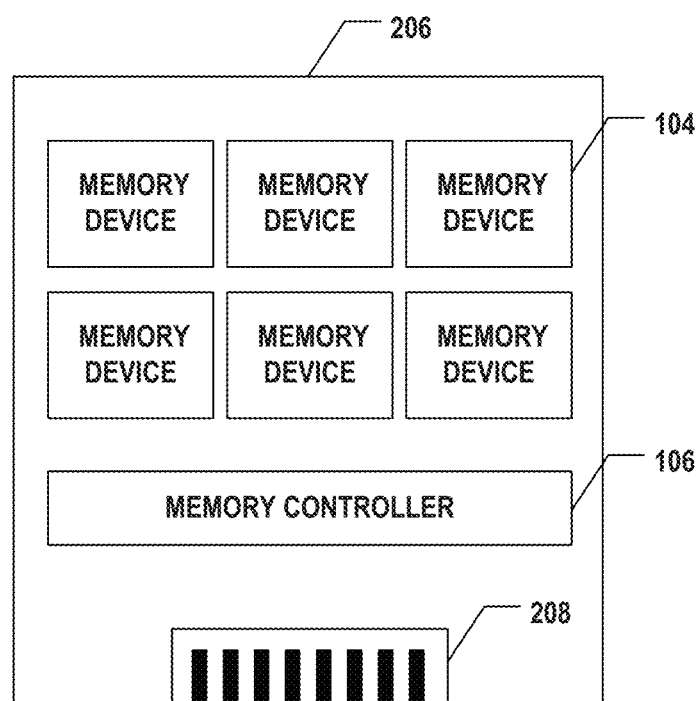
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
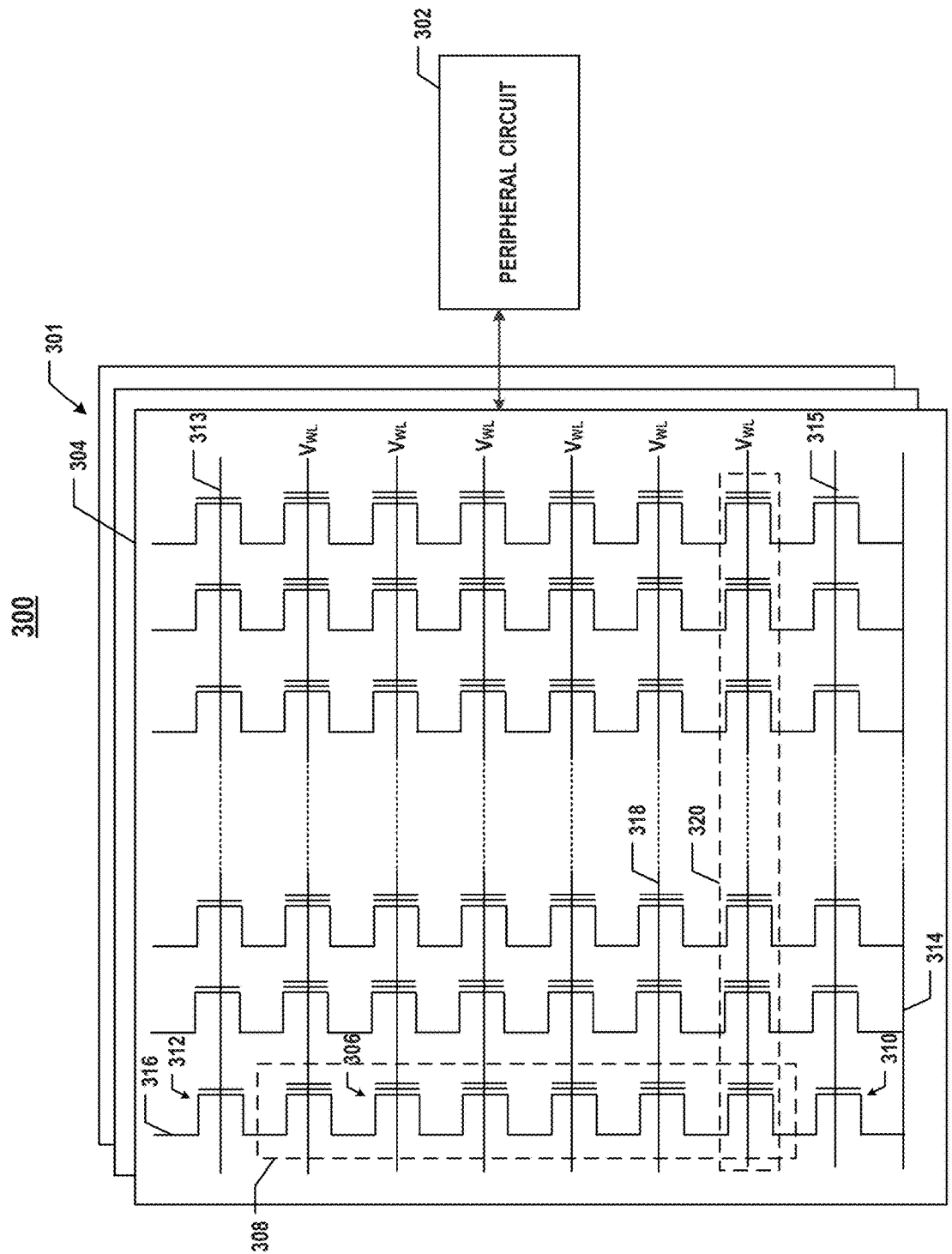
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
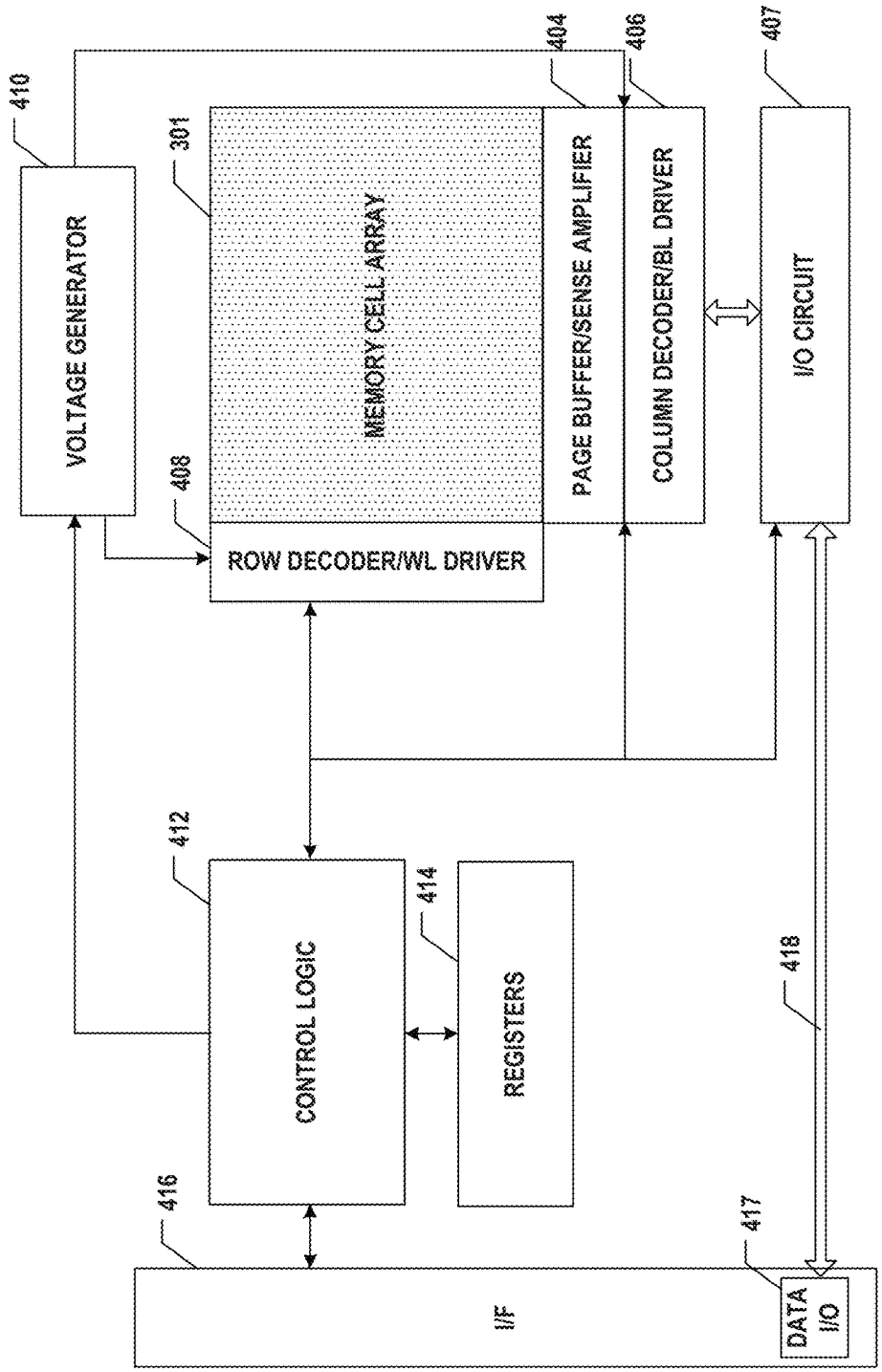
FIG. 4 illustrates a block diagram of an exemplary memory device including a memory cell array and peripheral circuits, according to some aspects of the present disclosure.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 4 illustrates some exemplary peripheral circuits 302 including a page buffer/sense amplifier 404, a column decoder/bit line driver 406, an I/O circuit 407, a row decoder/word line driver 408, a voltage generator 410, control logic 412, registers 414, an interface 416, and a data bus 418. It is understood that in some examples, additional peripheral circuits not shown in FIG. 4 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in read operation.

Column decoder/bit line driver 406 can be configured to be controlled by control logic 412 and select one or more NAND memory strings 308 by applying bit line voltages generated from voltage generator 410. I/O circuit 407 can be coupled to page buffer/sense amplifier 404 and/or column decoder/bit line driver 406 and configured to direct (route) the data input from data bus 418 to the desired memory cell areas (e.g., banks) of memory cell array 301, as well as the data output from the desired memory cell areas to data bus 418. As described below in detail, I/O circuit 407 can include a multiplexer (MUX) array to implement the flexible, data shift-based repair scheme disclosed herein, as controlled by control logic 412.

Row decoder/word line driver 408 can be configured to be controlled by control logic 412 and select block 304 of memory cell array 301 and a word line 318 of selected block 304. Row decoder/word line driver 408 can be further configured to drive the selected word line 318 using a word line voltage generated from voltage generator 410. Voltage generator 410 can be configured to be controlled by control logic 412 and generate the word line voltages (e.g., read voltage, program voltage, pass voltage, local voltage, and verification voltage) to be supplied to memory cell array 301.

Control logic 412 can be coupled to each peripheral circuit described above and configured to control operations of each peripheral circuits. Registers 414 can be coupled to control logic 412 and include status registers, command registers, and address registers for storing status information, command operation codes (OP codes), and command addresses for controlling the operations of each peripheral circuit. Interface 416 can be coupled to control logic 412 and act as a control buffer to buffer and relay control commands received from a host (not shown) to control logic 412 and status information received from control logic 412 to the host. Interface 416 can also be coupled to I/O circuit 407 via data bus 418 and act as a data I/O interface and a data buffer to buffer and relay the write data received from a host (not shown) to I/O circuit 407 and the read data from I/O circuit 407 to the host. For example, interface 416 may include a data I/O 417 coupled to data bus 418.

Figure 5:
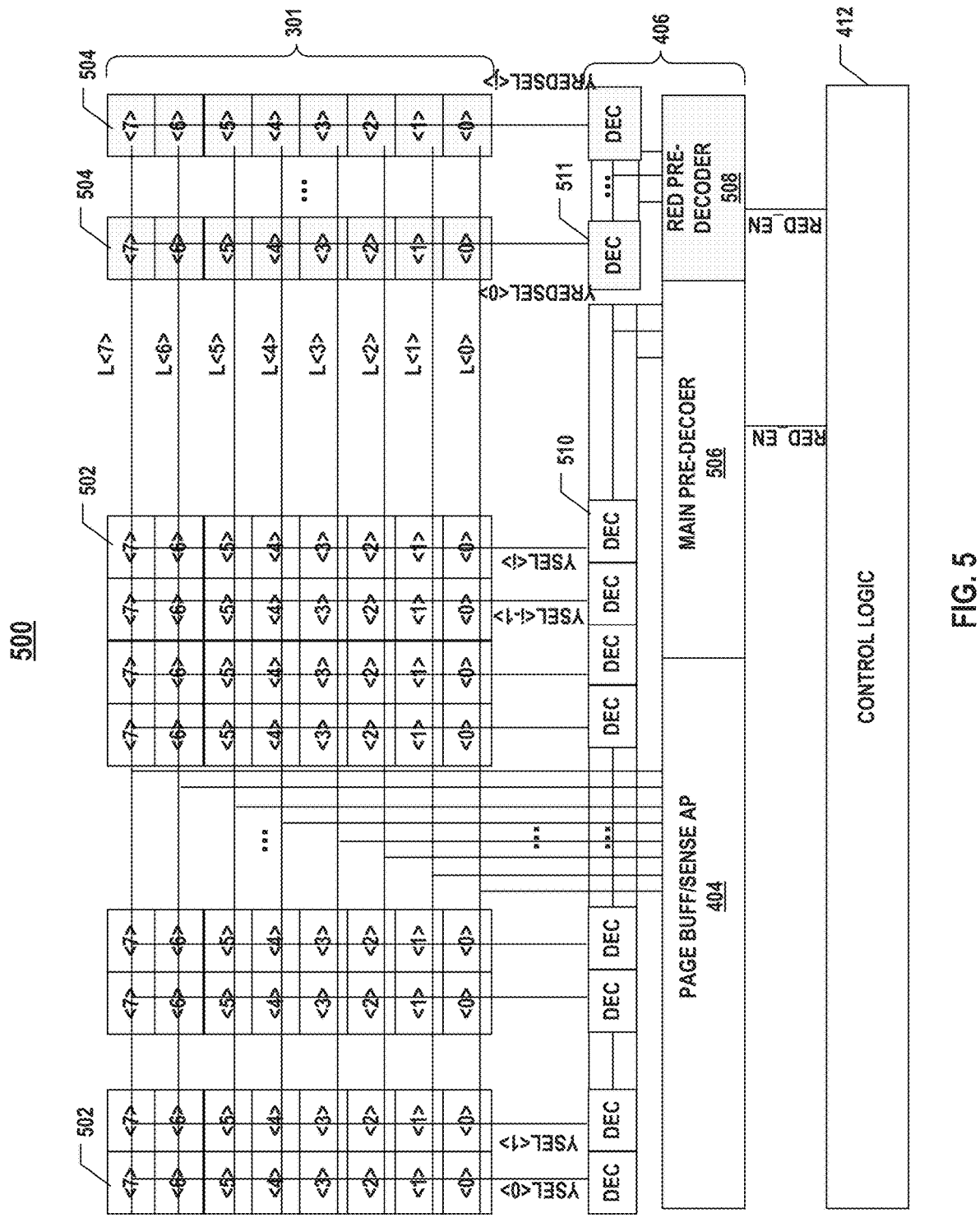
FIG. 5 illustrates a block diagram of a memory device that implements a failed main bank repair scheme using redundant banks.

FIG. 5 illustrates a block diagram of a memory device 500 that implements a failed main bank repair scheme using redundant banks. Memory cell array 301 in memory device 500 includes i sets of 8 main banks 502 (<0> . . . and <7>) and j sets of 8 redundant banks 504 (<0> . . . and <7>), and each main bank 502 is coupled to a respective redundant bank 504 via a respective data line (L<0> . . . , or L<7>). That is, each main bank 502 has its dedicated redundant bank 504 as its backup in case main bank 502 is identified as a failed main bank during the post-fabrication test. Memory device 500 is capable of concurrently inputting or outputting 8 pieces of data (e.g., 8 bytes) into 8 main banks 502, respectively. Memory device 500 includes i sets of 8 main banks 502 and j sets of 8 redundant banks 504.

Column decoder/bit line driver 406 of memory device 500 includes i main decoders 510 respectively coupled to i sets of 8 main banks 502 banks, and j redundant decoders 511 respectively coupled to j sets of 8 redundant banks 504. Column decoder/bit line driver 406 of memory device 500 also includes a main pre-decoder 506 coupled to i main decoders 510, and a redundant (RED) pre-decoder 508 coupled to j redundant decoders 511. Control logic 412 of memory device 500 implements a failed main bank repair scheme by controlling main pre-decoder 506 and redundant pre-decoder 508 through control signals, such as redundant enable signals (RED_EN). Based on the control signals from control logic 412, main pre-decoder 506 causes each of i main decoders 510 to disable any of 8 main banks 502, which is a failed main bank, in the respective main bank set using select/deselect signals (YSEL<0> . . . , and YSEL<i>). On the other hand, based on the control signals from control logic 412, redundant pre-decoder 508 causes each of j redundant decoder 511 to enable any of 8 redundant banks 504, which is coupled to the corresponding failed main bank through a respective bit line, in the respective redundant bank set using select/deselect signals (YREDSEL<0> . . . , and YREDSEL<j>). Page buffer/sense amplifier 404 of memory device 500 is shared by main banks 502 and redundant banks 504 for read and write operations.

FIGS. 6A and 6B illustrate a failed main bank repair scheme using redundant banks implemented by memory device 500 in FIG. 5. FIGS. 6A and 6B show one set of 8 main banks 502 and one set of 8 redundant banks 504. 8 main banks 502 include bank 0 low (B0_L), bank 0 high (B0_H), bank 1 low (B1_L), bank 1 high (B1_H), bank 2 low (B2_L), bank 2 high (B2_H), bank 3 low (B3_L), and bank 3 high (B3_H). 8 main banks 502 are separated from another other, meaning that a piece of data directed to one main bank 502 cannot be re-directed to another main bank 502 as they are not coupled by a data line. Instead, each main bank 502 is coupled to a respective redundant bank 504 (the adjacent one on the right as shown in FIGS. 6A and 6B) through a data line therebetween (e.g., L<0> . . . , or L<7> in FIG. 5).

FIG. 6A illustrates a case in which all 8 main banks 502 are working banks, i.e., no failed main bank identified by the post-fabrication test. In this case, the first 8 pieces of data (0 . . . , and 7) are respectively directed to or from 8 main banks 502, while all 8 redundant banks 504 are not used, i.e., without data (labeled as "x"). Similarly, the second 8 pieces of data (8 . . . , and 15) are again respectively directed to or from 8 main banks 502, while all 8 redundant banks 504 remain unused, i.e., without data (labeled as "x").

FIG. 6B illustrates cases in which one of 8 main banks 502 is a failed main bank identified by the post-fabrication test. In one example in which B2_H is a failed main bank, 7 of the first 8 pieces of data (0, 1, 2, 3, 4, 6, and 7) are respectively directed to or from 7 working main banks 502 (except for B2_H), while data (5) is re-directed to or from B2_H. That is, failed main bank B2_H is replaced by its dedicated backup—redundant bank 504 coupled to B2_H for data input and output. In another example in which B0_L is a failed main bank, 7 of the second 8 pieces of data (9 . . . , and 15) are respectively directed to or from 7 working main banks 502 (except B0_L), while data (8) is re-directed to or from redundant bank 504 coupled to B0_L. That is, failed main bank B0_L is replaced by its dedicated backup—redundant bank 504 coupled to B0_L for data input and output.

As described above, the redundant bank design and the associated repair scheme illustrated in FIGS. 5, 6A, and 6B suffer from various problems. First, 7 out of 8 redundant banks 504 are wasted, and only one of redundant banks 504 is used for repairing one failed main bank. Second, the repair scheme lacks flexibility since a failed main bank can only be replaced by a pre-assigned dedicated redundant bank 504. Third, each main bank 502 needs to be coupled to a respective redundant bank 504 through a data line, which increases the routing length of data line and the skew of data line.

To overcome one or more of those issues, the present disclosure provides an improved redundant bank design having a smaller number of redundant banks and an associated flexible, data shift-based repair scheme. Consistent with the scope of the present disclosure, a memory device can include an array of memory cells (e.g., memory cell array 301 in FIGS. 3 and 4), an I/O circuit (e.g., I/O circuit 407 in FIG. 4), and control logic (e.g., control logic 412 in FIG. 4). The array of memory cells can include N main banks and M redundant banks, where each of N and M is a positive integer, and N is great than M. That is, the array of memory cells can have a smaller number of redundant banks than the main banks. It is understood that similar to memory device 500 in FIG. 5, the array of memory cells may include multiple sets of the N main banks as well as multiple sets of the M redundant banks. Nevertheless, N is the number of pieces of data that can be concurrently inputted to (write/program) and outputted from (read) the array of memory cells. It is also understood that the term "bank" used herein (either in the contexts of "main bank," "redundant bank," or "working bank") may refer to a memory cell area in which one of the N pieces of concurrent data is directed to or from. A bank may be, for example, part of a page, a block, or a plane in the array of memory cells.

The I/O circuit can be coupled to the N main banks and the M redundant banks and configured to direct N pieces of data to or from N working banks, respectively. In some implementations, the I/O circuit is coupled to each pair of adjacent banks of the N main banks and the M redundant banks, such that the I/O circuit is configured to direct one piece of data of the N pieces of data to or from either bank of the pair of adjacent banks.

Figure 7:
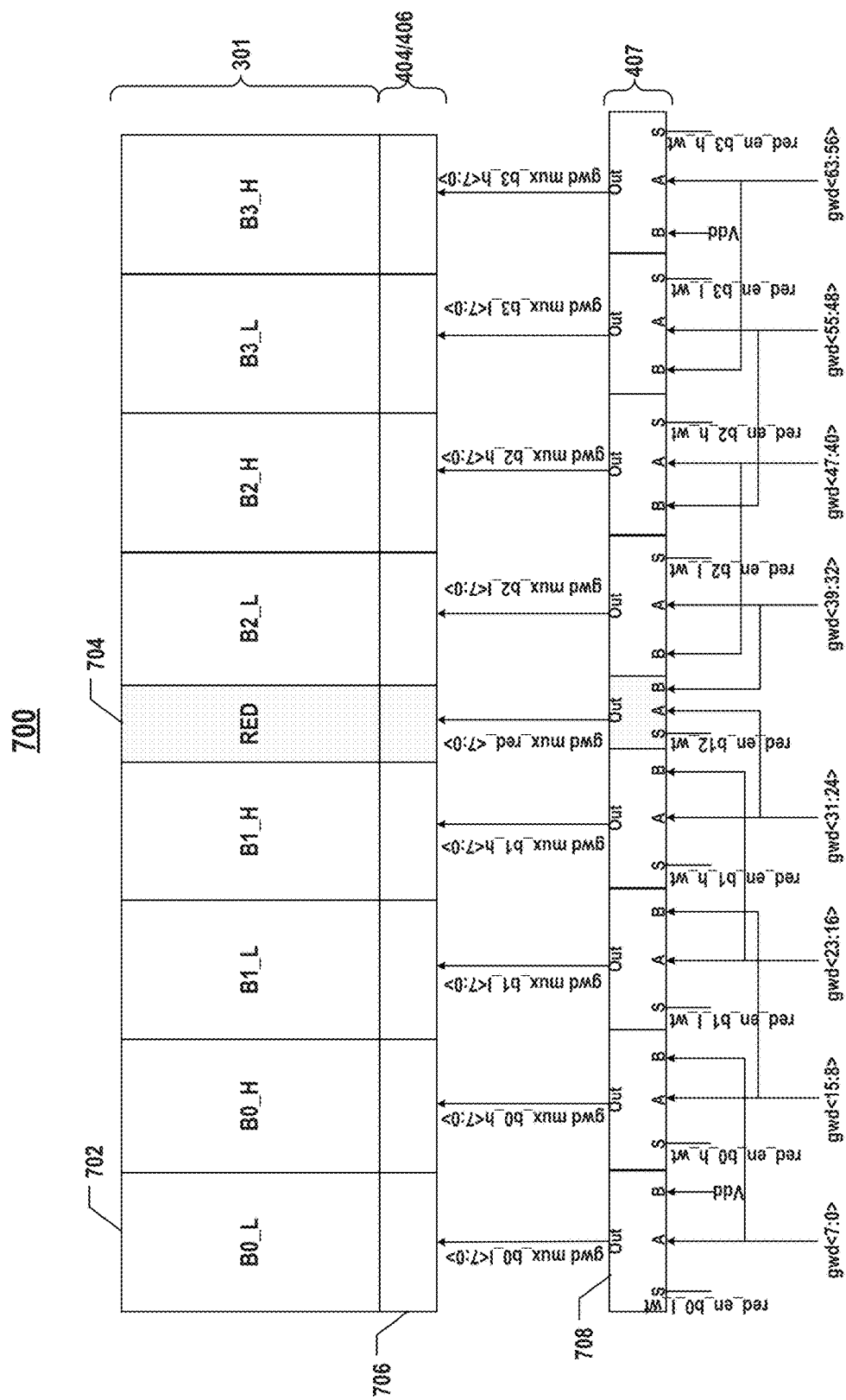
FIG. 7 illustrates a block diagram of an exemplary memory device that implements a failed main bank repair scheme using redundant banks in data input, according to some aspects of the present disclosure.
Figure 8:
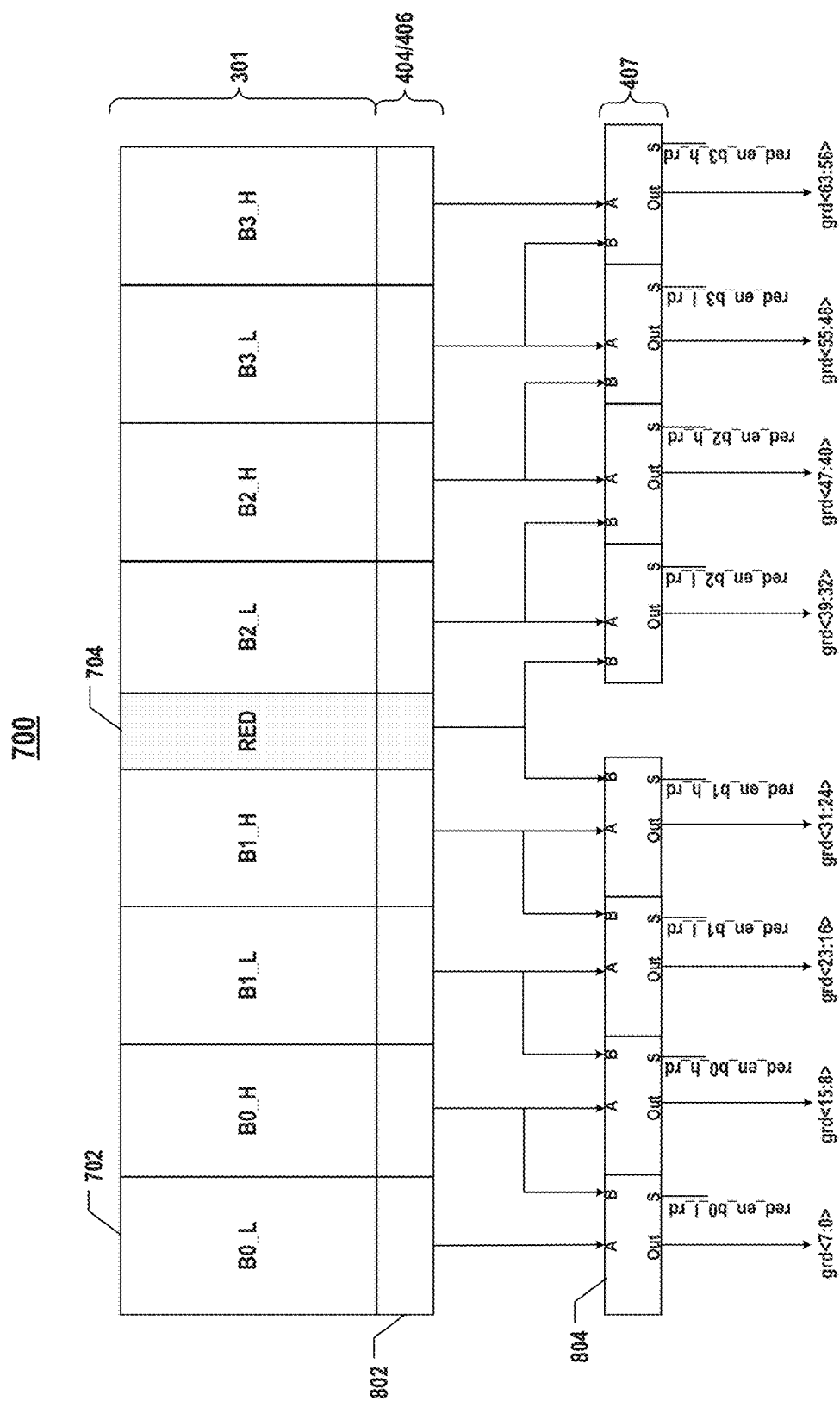
FIG. 8 illustrates a block diagram of an exemplary memory device that implements a failed main bank repair scheme using redundant banks in data output, according to some aspects of the present disclosure.

In some implementations, M equals 1. That is, a single redundant bank can be used to repair a set of N (2, 3, 4, 5, etc.) main banks, which can significantly reduce the chip area of redundant banks and the waste of unused redundant banks. For example, FIGS. 7 and 8 illustrate block diagrams of an exemplary memory device 700 that implements a failed main bank repair scheme using redundant banks in data input and data output, respectively, according to some aspects of the present disclosure. Memory device 700 may be an example of memory device 300 in FIGS. 3 and 4. For ease of description, details of components in memory device 300 may be omitted in describing memory device 700 and may be similarly applied to memory device 700. As shown in FIGS. 7 and 8, memory device 700 can include memory cell array 301 having 8 main banks 702 (B0_L, B0_H, B1_L, B1_H, B2_L, B2_H, B3_L, and B3_H), and 1 redundant bank 704 (RED). That is, N equals 8, and M equals 1 in memory device 700. In other words, memory cell array 301 includes 9 banks, which includes 8 main banks 702 and 1 redundant bank 704, according to some implementations.

I/O circuit 407 can be coupled to 8 main banks 702 and 1 redundant bank 704, for example, through page buffer/sense amplifier 404 and column decoder/bit line driver 406. In some implementations shown in FIG. 7, in data input (e.g., write operation), page buffer/sense amplifier 404 and column decoder/bit line driver 406 include 9 drivers 706 respectively coupled to 8 main banks 702 and 1 redundant banks 704. In some implementations shown in FIG. 8, in data output (e.g., read operation), page buffer/sense amplifier 404 and column decoder/bit line driver 406 include 9 sense amplifiers 802 respectively coupled to 8 main banks 702 and 1 redundant banks 704.

I/O circuit 407 can be configured to direct 8 pieces of data to or from 8 working banks, respectively. In some implementations shown in FIG. 7, in data input, I/O circuit 407 is configured to direct 8 pieces of input data (e.g., write data: gwd <7:0>, gwd <15:8>, gwd <23:16>, gwd <31:24>, gwd <39:32>, gwd <47:40>, gwd <55:48>, and gwd <63:56>) to 8 working banks of the 9 banks (i.e., 8 main banks 702 and 1 redundant bank 704), for example, 7 main banks 702 and 1 redundant bank 704. In some implementations shown in FIG. 8, in data output, I/O circuit 407 is configured to direct 8 pieces of output data (e.g., read data: grd <7:0>, grd <15:8>, grd <23:16>, grd <31:24>, grd <39:32>, grd <47:40>, grd <55:48>, and grd <63:56>) from 8 working banks of the 9 banks, for example, 7 main banks 702 and 1 redundant bank 704. As shown in FIGS. 7 and 8, in some implementations, I/O circuit 407 is coupled to each pair of adjacent banks, such that I/O circuit 407 is configured to direct one piece of write data (gwd) to either bank of the pair of adjacent banks or direct one piece of read data (grd) from either bank of the pair of adjacent banks. The pair of adjacent banks can be either both main banks 702 or one main bank 702 and one redundant bank 704. In some implementations, redundant bank 704 is coupled to two main banks 702 through I/O circuit 407. It is understood that although redundant bank 704 is coupled to two main banks 702 (B1_H and B2_L), respectively, by I/O circuit 407 in the middle of 8 main banks 702 as shown in FIGS. 7 and 8, in some examples, redundant bank 704 may be coupled to any two main banks 702, respectively, by I/O circuit 407 or coupled to only one main bank 702 (e.g., B0_L or B3_H) at the end of 8 main banks 702.

I/O circuit 407 can be implemented with a MUX array. In some implementations as shown in FIG. 7, I/O circuit 407 of memory device 700 includes a set of 9 write MUXs 708 respectively coupled to 8 main banks 702 and 1 redundant bank 704 for data input. Each write MUX 708 can include an output (Out), two inputs (A and B), and a select port (S). The output of each write MUX 708 is coupled to a respective bank 702 or 704. The select port of write MUX 708 can be configured to receive a write select signal (red_en_b0_1_wt . . . , red_en_b12_wt . . . , or red_en_b3_h_wt) indicative the selection of one input (A or B). For example, a positive bias write select signal, i.e., the write select signal is enabled, may select input B. In some implementations, except for write MUXs 708 coupled to the two main banks 702 (B0_L and B3_H) at the ends (i.e., coupled to only one another main bank 702), each write MUX 708 coupled to a respective main bank 702 has two inputs configured to input two pieces of data, respectively, including one piece of write data intended for respective main bank 702 and another piece of write data intended for adjacent main bank 702. For example, write MUX 708 coupled to B0_H may have input A configured to input write data gwd<15:8> and input B configured to input write data gwd<7:0>. As to write MUX 708 coupled to redundant bank 704, it can have two inputs configured to input two pieces of data, respectively, including one piece of write data intended for one adjacent main bank 702 and another piece of write data intended for another adjacent main bank 702. For example, write MUX 708 coupled to RED may have input A configured to input write data gwd<31:24> and input B configured to input write data gwd<39:32>. In other words, each piece of write data can be coupled to two inputs of two adjacent banks and be inputted to either input of the two adjacent banks. As to write MUXs 708 coupled to the two main banks 702 (B0_L and B3_H) at the ends, one of its input can be configured to input one piece of write data intended for respective main bank 702, and another one of its input can be configured to input a signal indicative of data inhibit, for example, a system voltage Vdd, due to bank failure.

In some implementations as shown in FIG. 8, I/O circuit 407 of memory device 700 includes a set of 8 read MUXs 804 coupled to 8 main banks 702 and 1 redundant bank 704 for data output. Each read MUX 804 can include an output (Out), two inputs (A and B), and a select port (S). The select port of read MUX 804 can be configured to receive a read select signal (red_en_b0_1_rd ... , or red_en_b3_h_rd) indicative of the selection of one input (A or B). For example, a positive bias read select signal, i.e., the read select signal is enabled, may select input B. In some implementations, each read MUX 804 has two inputs coupled to two adjacent banks. For example, the left-most read MUX 804 may have input A coupled to B0_L and input B coupled to B0_H; a middle read MUX 804 may have input A coupled to B1_H and input B coupled to RED. In other words, except for the two main banks 702 (B0_L and B3_H) at the ends, each bank 702 or 704 can be coupled to the inputs of two read MUXs 804, respectively. The output of each read MUX 804 can be configured to output one piece of data from either input A or B, i.e., either piece of data stored in two adjacent banks, based on the respective read select signal. For example, the read data gwd<7:0> outputted from the left-most read MUX 804 may be from either B0_L or B0_H; the read data gwd<31:24> outputted from a middle read MUX 804 may be from either B1_H or RED.

As described above with respect to FIGS. 7 and 8, I/O circuit 407 can be coupled to each pair of adjacent banks and configured to direct a piece of data to or from either bank of each pair of adjacent banks. It is understood that although the exemplary design of MUX array in I/O circuit 407 is described above with respect to memory device 700, which has 8 main banks 702 and 1 redundant bank 704, the similar design may be generally applied to a memory device that has M main banks and N redundant banks, where each of N and M is a positive integer, and N is great than M. Based on the design of redundant banks in the memory cell array and the MUX array in the I/O circuit, a flexible, data shift-based repair scheme can be implemented. Control logic can be coupled to the I/O circuit and configured to determine the N working banks from the N main banks and the M redundant banks based on bank fail information indicative of K failed main banks of the N main banks. The N working banks can include K redundant banks of the M redundant banks, where K is a positive integer not greater than M The control logic can be further configured to control the I/O circuit to direct K pieces of data of the N pieces of data to or from the K redundant banks, respectively.

Figure 9:
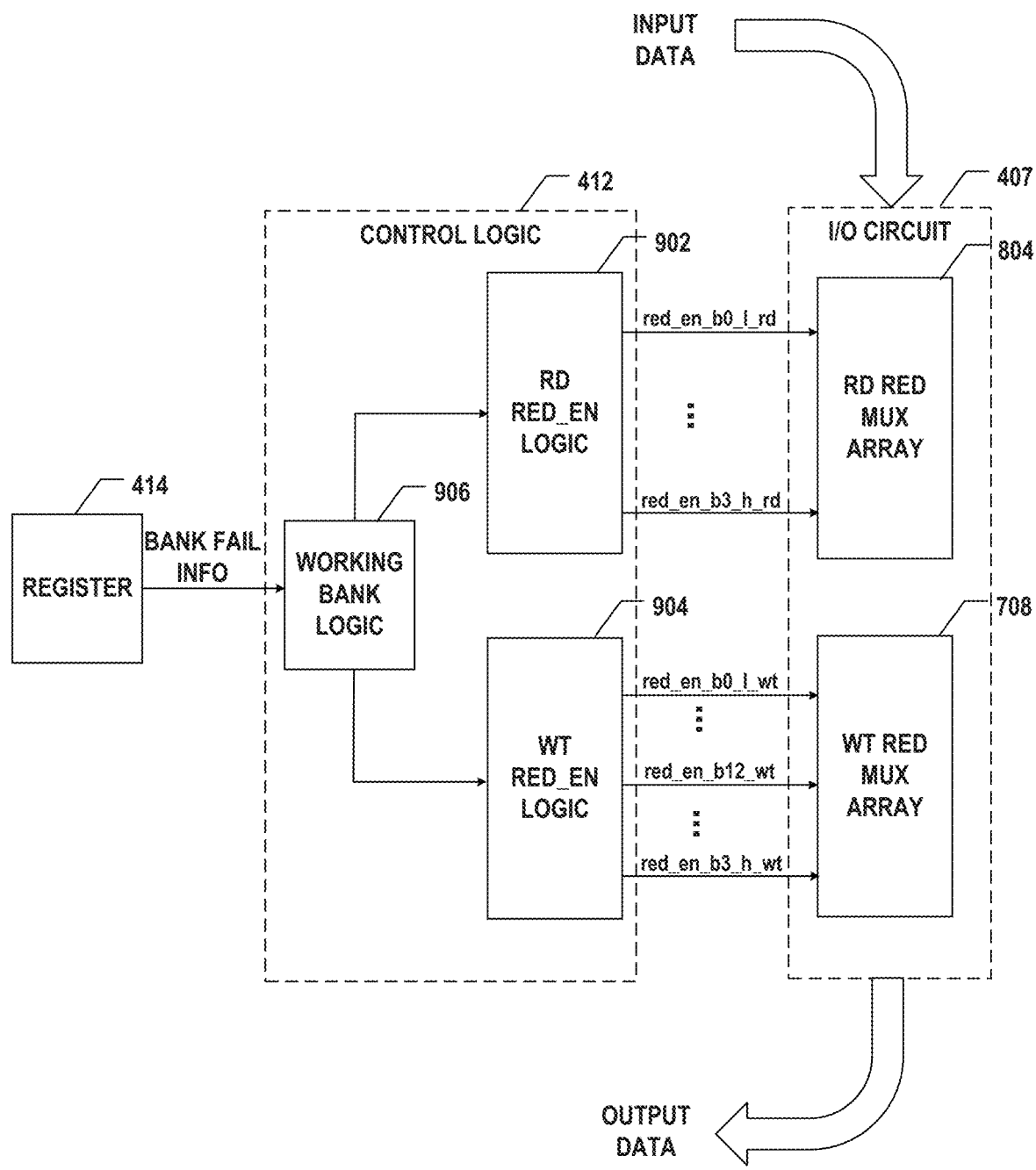
FIG. 9 illustrates a block diagram of exemplary control logic of the memory device in FIGS. 7 and 8, according to some aspects of the present disclosure.

For example, as shown in FIG. 9, control logic 412 may include read redundant enable logic 902, write redundant enable logic 904, and working bank logic 906. Each logic 902, 904, or 906 can be implemented by microprocessors, microcontrollers (a.k.a. microcontroller units (MCUs)), digital signal processors (DSPs), application-specific integrated circuits (ASICs), field-programmable gate arrays (FPGAs), programmable logic devices (PLDs), state machines, gated logic, discrete hardware circuits, and other suitable hardware, firmware, and/or software configured to perform the various functions described below in detail. In some implementations, one or more of read redundant enable logic 902, write redundant enable logic 904, and working bank logic 906 are implemented with content-addressable memory (CAM).

In some implementations, working bank logic 906 is coupled to register 414 and configured to obtain the bank fail information indicative of one or more failed main banks of the main banks of a memory device (e.g., memory device 700), for example, K failed main banks of the N main banks. During the post-fabrication test, bad (non-functional) memory cells can be detected from the memory device, and each main bank including at least one bad memory cell can be identified as a failed main bank. In some implementations, the bank fail information indicates each of the failed main banks of the memory device and is saved in the memory device, for example, in register 414. Thus, each memory device may have its own bank fail information. Before operating the memory device, working bank logic 906 can obtain the bank fail information from registers 414 and determine the N working banks of the memory device that can be used for data input and output. The number (N) of the working banks is the same as the (N) number of pieces of concurrent input/output data (e.g., 8 in memory device 700), according to some implementations. That is, working bank logic 906 can replace the K failed main banks with the same number (K) of redundant banks, such that the N working banks can include K redundant banks and N-K main banks. In memory device 700, one failed main bank of 8 main banks 702 can be replaced with redundant bank 704 to form 8 working banks, as determined by working bank logic 906 of control logic 412.

Based on the determined N working banks, read redundant enable logic 902 and write redundant enable logic 904 can be configured to control I/O circuit 407 to direct K pieces of data of the N pieces of data to or from the K redundant banks, respectively. In some implementations, for data input, write redundant enable logic 904 is coupled to write MUXs 708 of I/O circuit 407 and is configured to provide 9 write select signals (e.g., red_en_b0_1_wt ... , red_en_b12_wt ... , and red_en_b3_h_wt)) to 9 write MUXs 708, respectively, based on the determined 8 working banks. In some implementations, for data output, read redundant enable logic 902 is coupled to read MUXs 804 of I/O circuit 407 and is configured to provide 8 read select signals (e.g., red_en_b0_1_rd ... , and red_en_b3_h_rd)) to 8 read MUXs 804, respectively, based on the determined 8 working banks. In some implementations, read redundant enable logic 902 and write redundant enable logic 904 also provide synchronization signals to the strobe clocks of read MUXs 804 and write MUXs 708, respectively, to align data and the select signals.

Each select signal can be enabled (e.g., positive biased) or disabled (e.g., negative biased) based on the K failed main banks. In some implementations, if a first bank of a pair of adjacent banks is one failed main bank of the K failed main banks, read redundant enable logic 902 and write redundant enable logic 904 are configured to control I/O circuit 407 to direct the piece of data to or from a second bank of the pair of adjacent banks. That is, control logic 412 is configured to select one bank of each pair of adjacent banks based on bank fail information and control I/O circuit 407 to direct the piece of data to or from the selected bank of each pair of adjacent banks, according to some implementations.

Referring now to FIG. 7, in data input, write redundant enable logic 904 can be configured to control a first write MUX 708 coupled to the first bank (i.e., a failed main bank)

to inhibit inputting the piece of data from input A of first write MUX 708 and outputting the piece of data to the first bank. Instead, write redundant enable logic 904 can be configured to control a second write MUX 708 coupled to the second bank (e.g., a main bank 702 or redundant bank 704 adjacent to the first bank) to enable inputting the piece of data from input B of second write MUX 708 and outputting the piece of data to the second bank. That is, the piece of data intended for a failed main bank can be re-directed to its adjacent bank, either a main bank 702 or a redundant bank 704, by write MUX 708 coupled to the failed main bank as controlled by write redundant enable logic 904. The same operation can be applied to each pair of adjacent banks, such that data input is shifted between adjacent banks.

For example, assuming B0_L is a failed main bank, write redundant enable logic 904 may enable red_en_b0_1_wt and red_en_b0_h_wt, such that Vdd is inputted to B0_L from input B, and gwd<7:0> is re-directed and inputted to B0_H from input B. To shift data input, write redundant enable logic 904 may also enable red_en_b1_1_wt and red_en_b1_h_wt, such that gwd<15:8> is re-directed and inputted to B1_L from input B, and gwd<23:16> is re-directed and inputted to B1_H from input B. Write redundant enable logic 904 may further disable red_en_b12_wt such that gwd<31:24> is re-directed and inputted to RED from input A. That is, the input data may be shifted from the failed main bank B0_L to the redundant bank RED, accordingly. For other main banks B2_L, B2_H, B3_L, and B3_H, no input data shift may be needed, such that write redundant enable logic 904 may disable red_en_b2_1_wt, red_en_b2_h_wt, red_en_b3_1_wt, and red_en_b3_h_wt. As a result, each of B2_L, B2_H, B3_L, and B3_H may still input data from inputs A without data shift.

Referring now to FIG. 8, in data output, read redundant enable logic 902 can be configured to control read MUX 804 coupled to the first and second banks (i.e., a failed main bank and a main bank 702 or redundant bank 704 adjacent to the failed main bank) to enable outputting the piece of data from the second bank (e.g., main bank 702 or redundant bank 704 adjacent to the failed main bank). That is, the piece of data intended for the failed main bank can be re-directed from its adjacent bank, either main bank 702 or redundant bank 704, by read MUX 804 as controlled by read redundant enable logic 902. The same operation can be applied to each pair of adjacent banks, such that data output is shifted between adjacent banks.

For example, assuming B0_L is a failed main bank, read redundant enable logic 902 may enable red_en_b0_1_rd, such that grd<7:0> is re-directed and outputted from B0_H coupled to input B. To shift data output, read redundant enable logic 902 may also enable red_en_b0_h_rd, red_en_b1_1_rd, and red_en_b1_h_rd, such that grd<15:8> is re-directed and outputted from B1_L coupled to input B, grd<23:16> is re-directed and outputted from B1_H coupled to input B, and grd<31:24> is re-directed and outputted from RED coupled to input B. That is, the output data may be shifted from the failed main bank B0_L to the redundant bank RED, accordingly. For other main banks B2_L, B2_H, B3_L, and B3_H, no output data shift may be needed, such that read redundant enable logic 902 may disable red_en_b2_1_rd, red_en_b2_h_rd, red_en_b3_1_rd, and red_en_b3_h_rd. As a result, data may still be outputted from B2_L, B2_H, B3_L, and B3_H from inputs A without data shift.

FIGS. 10A-10C illustrate further examples of failed main bank repair scheme using redundant bank 704 implemented by memory device 700, according to some aspects of the present disclosure. FIG. 10A illustrates a case in which all 8 main banks 702 are working banks, i.e., no failed main bank identified by the post-fabrication test. In this case, the first 8 pieces of data (0 . . . , and 7) may be respectively directed to or from 8 main banks 702, while redundant bank 704 may not be used, i.e., without data (labeled as "x"). Similarly, the second 8 pieces of data (8 . . . , and 15) may be again respectively directed to or from 8 main banks 702, while redundant bank 704 may remain unused, i.e., without data (labeled as "x").

FIGS. 10B and 10C illustrate cases in which one of 8 main banks 702 is a failed main bank identified by the post-fabrication test. As shown in FIG. 10B, in one example in which B2_H is a failed main bank, the first 4 of the first 8 pieces of data (1, 2, 3, and 4) may be respectively directed to or from the 4 corresponding working main banks B0_L, B0_H, B1_L, and B1_H, which are separated by redundant bank 704 from B2_H. Data (5) intended for B2_H may be re-directed to adjacent working main bank B2_L, and data (4) intended for B2_L may be re-directed to redundant bank 704 (data shifting left). B2_H may become unused. That is, data shift may occur between B2_H and redundant bank 704. The last 2 of the first 8 pieces of data (6 and 7) may be respectively directed to or from the 2 corresponding working main banks B3_L and B3_H without data shift. In another example in which B0_L is a failed main bank, the first 4 of the second 8 pieces of data (8, 9, 10, and 11) may be respectively re-directed to or from adjacent working main banks B0_H, B1_L, and B1_H as well as redundant bank 704 (data shifting right). B0_L may become unused. That is, data shift may occur between B0_L and redundant bank 704. The last 4 of the second 8 pieces of data (12, 13, 14, and 15) may be respectively directed to or from the 4 corresponding working main banks B2_L, B2_H, B3_L, and B3_H without data shift.

As shown in FIG. 10C, in one example in which B1_L is a failed main bank, the first 2 of the first 8 pieces of data (0 and 1) may be respectively directed to or from the 2 corresponding working main banks B0_L and B0_H. The next 2 of the first 8 pieces of data (2 and 3) may be respectively re-directed to or from adjacent working main bank B1_H as well as redundant bank 704 (data shifting right). B1_L may become unused. That is, data shift may occur between B1_L and redundant bank 704. The last 4 of the second 8 pieces of data (4, 5, 6, and 7) may be respectively directed to or from the 4 corresponding working main banks B2_L, B2_H, B3_L, and B3_H without data shift. In another example in which B2_L is a failed main bank, the first 4 of the second 8 pieces of data (8, 9, 10, and 11) may be respectively directed to or from corresponding working main banks B0_L, B0_H, B1_L, and B1_H, which are separated by redundant bank 704 from B2_L. Data (12) intended for B2_L may be re-directed to or from redundant bank 704 (data shifting left), and B2_L may become unused. That is, data shift may occur between B2_L and redundant bank 704. The last 3 of the second 8 pieces of data (13, 14, and 15) may be respectively directed to or from the 3 corresponding working main banks B2_H, B3_L, and B3_H without data shift.

Figure 11:
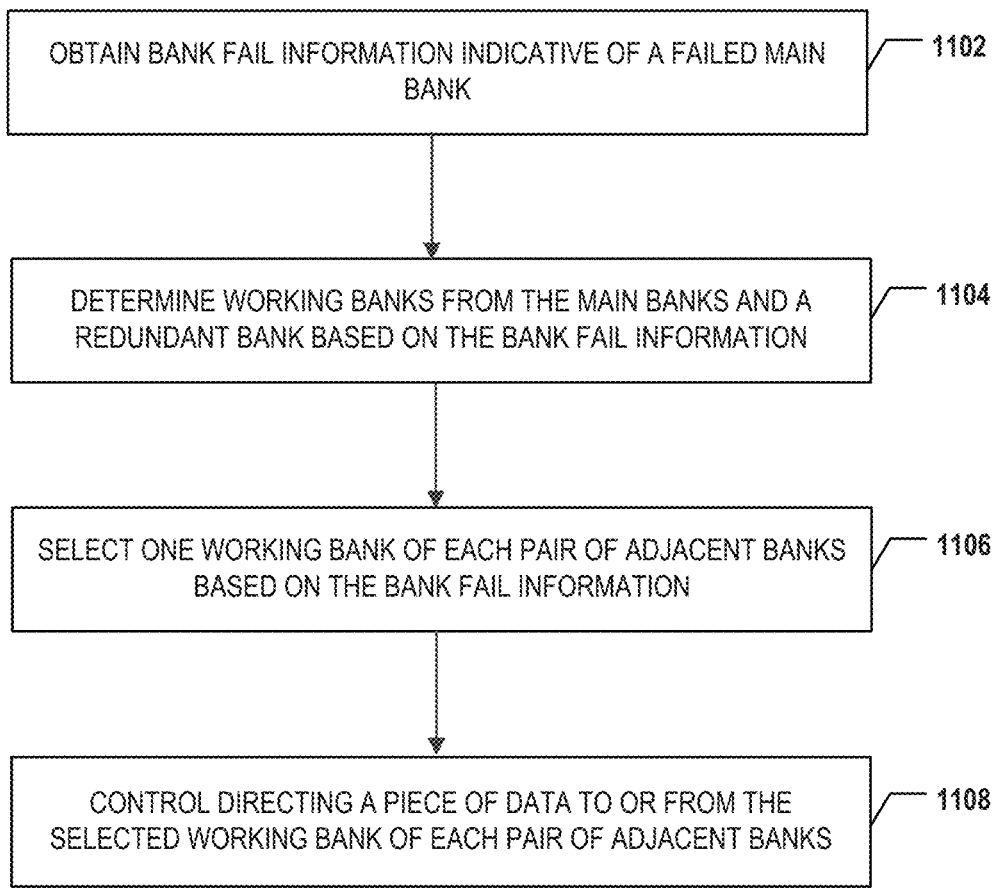
FIG. 11 illustrates a flowchart of an exemplary method for operating a memory device having a failed main bank and a redundant bank, according to some aspects of the present disclosure.

FIG. 11 illustrates a flowchart of an exemplary method 1100 for operating a memory device having a failed main bank and a redundant bank, according to some aspects of the present disclosure. The memory device may be any suitable memory device disclosed herein. Method 1100 may be implemented by control logic 412. It is understood that the operations shown in method 1100 may not exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which bank fail information indicative of a failed main bank of the plurality of main banks is obtained. The failed main bank can be identified by the post-fabrication test of the memory device. For example, working bank logic 906 may obtain the bank fail information from registers 414 before operating the memory device.

Method 1100 proceeds to operation 1104, as illustrated in FIG. 11, in which a plurality of working banks are determined from the plurality of main banks and the redundant bank based on the bank fail information. The plurality of working banks can include the redundant bank. For example, working bank logic 906 may determine the working banks that include the redundant bank and the remaining main banks.

Method 1100 proceeds to operation 1106, as illustrated in FIG. 11, in which one bank of each pair of adjacent banks of the plurality of banks is selected based on the bank fail information. The selected bank is a working bank, according to some implementations. For example, working bank logic 906 may select one working bank of each pair of adjacent banks based on the bank fail information.

Method 1100 proceeds to operation 1108, as illustrated in FIG. 11, in which directing a piece of data to or from the selected bank of each pair of adjacent banks is controlled. To control directing the piece of data, a first bank of one pair of adjacent banks is determined to be the failed main bank, and the piece of data is directed to or from a second bank of the pair of adjacent banks is controlled, according to some implementations. In one example, write redundant enable logic 904 may control a first write MUX 708 to inhibit outputting the piece of data to the first bank, and control a second write MUX 708 to enable outputting the piece of data to the second bank. In another example, read redundant enable logic 902 may control a read MUX 804 to enable outputting the piece of data from the second bank.

Figure 12:
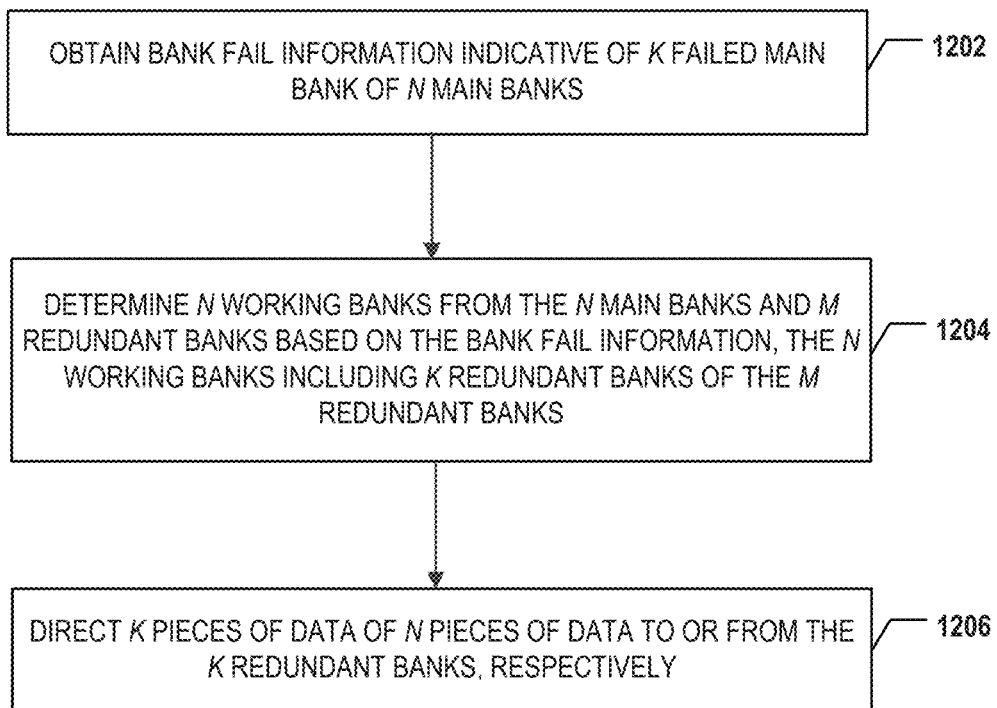
FIG. 12 illustrates a flowchart of another exemplary method for operating a memory device having a failed main bank and a redundant bank, according to some aspects of the present disclosure.

FIG. 12 illustrates a flowchart of another exemplary method 1200 for operating a memory device having a failed main bank and a redundant bank, according to some aspects of the present disclosure. The memory device may be any suitable memory device disclosed herein. Method 1200 may be implemented by control logic 412. It is understood that the operations shown in method 1200 may not exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which bank fail information indicative of K failed main bank of N main banks is obtained. K can be a positive integer not greater than N. The K failed main bank can be identified by the post-fabrication test of the memory device. For example, working bank logic 906 may obtain the bank fail information from registers 414 before operating the memory device.

Method 1200 proceeds to operation 1204, as illustrated in FIG. 12, in which N working banks are determined from the N main banks and the M redundant banks based on bank fail information. The N working banks can include K redundant banks of the M redundant banks. For example, working bank logic 906 may determine the N working banks that include K redundant bank and the remaining main banks. In some implementations, M equals 1, and one working bank is selected from each pair of adjacent banks of the N main banks and the redundant bank based on the bank fail information.

Method 1200 proceeds to operation 1206, as illustrated in FIG. 12, in which K pieces of data of N pieces of data are directed to or from the K redundant banks, respectively. In some implementations, M equals 1, and one piece of data of the K pieces of data is directed to or from the selected working bank of each pair of adjacent banks of the N main banks and the redundant bank.

According to an aspect of the present disclosure, a memory device includes an array of memory cells, an I/O circuit, and control logic coupled to the I/O circuit. The array of memory cells includes a plurality of banks including a plurality of main banks and a redundant bank. The I/O circuit is coupled to each pair of adjacent banks of the plurality of banks and configured to direct a piece of data to or from either bank of each pair of adjacent banks. The control circuit is configured to select one bank of each pair of adjacent banks based on bank fail information indicative of a failed main bank of the plurality of main banks. The control circuit is further configured to control the I/O circuit to direct the piece of data to or from the selected bank of each pair of adjacent banks.

In some implementations, at least one pair of adjacent banks are both main banks.

In some implementations, a first bank of one pair of adjacent banks is the failed main bank, and the control logic is configured to control the I/O circuit to direct the piece of data to or from a second bank of the pair of adjacent banks.

In some implementations, the I/O circuit includes a first write MUX having an output coupled to the first bank and two inputs, one of which is configured to input the piece of data, and a second write MUX having an output coupled to the second bank and two inputs configured to input the piece of data and another piece of data, respectively.

In some implementations, the control logic is further configured to control the first write MUX to inhibit outputting the piece of data to the first bank, and control the second write MUX to enable outputting the piece of data to the second bank.

In some implementations, the I/O circuit includes a read MUX having two inputs coupled to the first and second banks, respectively, and an output configured to output the piece of data.

In some implementations, the control logic is further configured to control the read MUX to enable outputting the piece of data from the second bank.

In some implementations, the redundant bank is coupled to two main banks of the plurality of main banks through the I/O circuit.

In some implementations, the memory device includes a 3D NAND memory device.

According to another aspect of the present disclosure, a system includes a memory device configured to store data and a memory controller coupled to the memory device and configured to control the memory device. The memory device includes an array of memory cells, an I/O circuit, and control logic coupled to the I/O circuit. The array of memory cells includes a plurality of banks including a plurality of main banks and a redundant bank. The I/O circuit is coupled to each pair of adjacent banks of the plurality of banks and configured to direct a piece of data to or from either bank of each pair of adjacent banks. The control circuit is configured to select one bank of each pair of adjacent banks based on bank fail information indicative of a failed main bank of the plurality of main banks. The control circuit is further configured to control the I/O circuit to direct the piece of data to or from the selected bank of each pair of adjacent banks.

In some implementations, the system further includes a host coupled to the memory controller and configured to send or receive the data.

In some implementations, at least one pair of adjacent banks are both main banks.

In some implementations, a first bank of one pair of adjacent banks is the failed main bank, and the control logic is configured to control the I/O circuit to direct the piece of data to or from a second bank of the pair of adjacent banks.

In some implementations, the I/O circuit includes a first write MUX having an output coupled to the first bank and two inputs, one of which is configured to input the piece of data, and a second write MUX having an output coupled to the second bank and two inputs configured to input the piece of data and another piece of data, respectively.

In some implementations, the control logic is further configured to control the first write MUX to inhibit outputting the piece of data to the first bank, and control the second write MUX to enable outputting the piece of data to the second bank.

In some implementations, the I/O circuit includes a read MUX having two inputs coupled to the first and second banks, respectively, and an output configured to output the piece of data.

In some implementations, the control logic is further configured to control the read MUX to enable outputting the piece of data from the second bank.

In some implementations, the redundant bank is coupled to two main banks of the plurality of main banks through the I/O circuit.

According to still another aspect of the present disclosure, a method for operating a memory device is provided. The memory device includes an array of memory cells including a plurality of banks. The plurality of banks include a plurality of main banks and a redundant bank. Bank fail information indicative of a failed main bank of the plurality of main banks is obtained. One bank of each pair of adjacent banks of the plurality of banks is selected based on the bank fail information. Directing a piece of data to or from the selected bank of each pair of adjacent banks is controlled.

In some implementations, a plurality of working banks are determined from the plurality of main banks and the redundant bank based on the bank fail information. The plurality of working banks can include the redundant bank. The selected bank can be in the plurality of working banks.

In some implementations, to control directing the piece of data, a first bank of one pair of adjacent banks is determined to be the failed main bank, and directing the piece of data to or from a second bank of the pair of adjacent banks is controlled.

In some implementations, the memory device further includes a first write MUX having an output coupled to the first bank and two inputs, one of which is configured to input the piece of data, and a second write MUX having an output coupled to the second bank and two inputs configured to input the piece of data and another piece of data, respectively. In some implementations, the first write MUX is controlled to inhibit outputting the piece of data to the first bank, and a second write MUX is controlled to enable outputting the piece of data to the second bank.

In some implementations, the memory device further includes a read MUX having two inputs coupled to the first and second banks, respectively, and an output configured to output the piece of data. In some implementations, the read MUX is controlled to enable outputting the piece of data from the second bank.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
   an array of memory cells comprising a plurality of banks, the plurality of banks comprising a plurality of main banks and a redundant bank;
   an input/output (I/O) circuit coupled to each pair of adjacent banks of the plurality of banks and configured to direct a piece of data to or from either bank of each pair of adjacent banks; and
   control logic coupled to the I/O circuit and configured to:
   select one bank of each pair of adjacent banks based on bank fail information indicative of a failed main bank of the plurality of main banks; and
   control the I/O circuit to direct the piece of data to or from the selected bank of each pair of adjacent banks,
   wherein the I/O circuit comprises a plurality of write multiplexers, each of the plurality of banks being coupled to one write multiplexer of the plurality of write multiplexers on a one-to-one connection.

2. The memory device of claim 1, wherein at least one pair of adjacent banks are both main banks.

3. The memory device of claim 1, wherein
   a first bank of one pair of adjacent banks is the failed main bank; and
   the control logic is configured to control the I/O circuit to direct the piece of data to or from a second bank of the pair of adjacent banks.

4. The memory device of claim 3, wherein the plurality of write multiplexers comprise:
   a first write multiplexer (MUX) having an output coupled to the first bank and two inputs, one of which is configured to input the piece of data; and
   a second write MUX having an output coupled to the second bank and two inputs configured to input the piece of data and another piece of data, respectively.

5. The memory device of claim 4, wherein the control logic is further configured to:
   control the first write MUX to inhibit outputting the piece of data to the first bank; and
   control the second write MUX to enable outputting the piece of data to the second bank.

6. The memory device of claim 3, wherein the I/O circuit comprises a read MUX having two inputs coupled to the first and second banks, respectively, and an output configured to output the piece of data.

7. The memory device of claim 6, wherein the control logic is further configured to control the read MUX to enable outputting the piece of data from the second bank.

8. The memory device of claim 1, wherein the redundant bank is coupled to two main banks of the plurality of main banks through the I/O circuit.

9. The memory device of claim 1, wherein the memory device includes a three-dimensional (3D) NAND memory device.

10. A system, comprising:
a memory device configured to store data, the memory device comprising:
an array of memory cells comprising a plurality of banks, the plurality of banks comprising a plurality of main banks and a redundant bank;
an input/output (I/O) circuit coupled to each pair of adjacent banks of the plurality of banks and configured to direct a piece of data to or from either bank of each pair of adjacent banks; and
control logic coupled to the I/O circuit and configured to:
select one bank of each pair of adjacent banks based on bank fail information indicative of a failed main bank of the plurality of main banks; and
control the I/O circuit to direct the piece of data to or from the selected bank of each pair of adjacent banks,
wherein the I/O circuit comprises a plurality of write multiplexers, each of the plurality of banks being coupled to one write multiplexer of the plurality of write multiplexers on a one-to-one connection; and
a memory controller coupled to the memory device and configured to control the memory device.

11. The system of claim 10, further comprising a host coupled to the memory controller and configured to send or receive the data.

12. The system of claim 10, wherein
a first bank of one pair of adjacent banks is the failed main bank; and
the control logic is configured to control the I/O circuit to direct the piece of data to or from a second bank of the pair of adjacent banks.

13. The system of claim 12, wherein the plurality of write multiplexers comprise:
a first write multiplexer (MUX) having an output coupled to the first bank and two inputs, one of which is configured to input the piece of data; and
a second write MUX having an output coupled to the second bank and two inputs configured to input the piece of data and another piece of data, respectively.

14. The system of claim 12, wherein
the I/O circuit further comprises a read MUX having two inputs coupled to the first and second banks, respectively, and an output configured to output the piece of data.

15. The system of claim 10, wherein the redundant bank is coupled to two main banks of the plurality of main banks through the I/O circuit.

16. A method for operating a memory device, the memory device comprising an array of memory cells comprising a plurality of banks, the plurality of banks comprising a plurality of main banks and a redundant bank, the method comprising:
obtaining bank fail information indicative of a failed main bank of the plurality of main banks;
selecting one bank of each pair of adjacent banks of the plurality of banks based on the bank fail information, comprising:
controlling a first write multiplexer (MUX) to inhibit an input to one main bank from two adjacent main banks of the plurality of banks, the same input being directed to another main bank of the two adjacent main banks through a second write MUX; and
controlling directing a piece of data to or from the selected bank of each pair of adjacent banks.

17. The method of claim 16, further comprising determining a plurality of working banks from the plurality of main banks and the redundant bank based on the bank fail information, the plurality of working banks comprising the redundant bank, wherein the selected bank is in the plurality of working banks.

18. The method of claim 16, wherein controlling directing the piece of data comprises:
determining that a first bank of one pair of adjacent banks is the failed main bank; and
controlling directing the piece of data to or from a second bank of the pair of adjacent banks.

19. The method of claim 18, wherein
the memory device further comprises a third write multiplexer (MUX) having an output coupled to the first bank and two inputs, one of which is configured to input the piece of data, and a fourth write MUX having an output coupled to the second bank and two inputs configured to input the piece of data and another piece of data, respectively; and
the method further comprises controlling the third write MUX to inhibit outputting the piece of data to the first bank, and controlling the fourth write MUX to enable outputting the piece of data to the second bank.

20. The method of claim 18, wherein
the memory device further comprises a read MUX having two inputs coupled to the first and second banks, respectively, and an output configured to output the piece of data; and
the method further comprises controlling the read MUX to enable outputting the piece of data from the second bank.

* * * * *